(12) United States Patent
Dejima et al.

(10) Patent No.: US 11,387,623 B2
(45) Date of Patent: Jul. 12, 2022

(54) LIGHT SOURCE DEVICE AND EXTERNAL CAVITY LASER MODULE

(71) Applicant: NICHIA CORPORATION, Anan (JP)

(72) Inventors: Norihiro Dejima, Yokohama (JP); Masaki Omori, Toshima-ku (JP); Yuto Oki, Yokohama (JP)

(73) Assignee: NICHIA CORPORATION, Anan (JP)

( * ) Notice: Subject to any disclaimer, the term of this patent is extended or adjusted under 35 U.S.C. 154(b) by 240 days.

(21) Appl. No.: 16/896,448

(22) Filed: Jun. 9, 2020

(65) Prior Publication Data

US 2020/0388991 A1 Dec. 10, 2020

(30) Foreign Application Priority Data

Jun. 10, 2019 (JP) .............................. JP2019-107917

(51) Int. Cl.
| | |
|---|---|
| H01S 3/10 | (2006.01) |
| H01S 5/02375 | (2021.01) |
| H01S 5/14 | (2006.01) |
| H01S 5/40 | (2006.01) |

(52) U.S. Cl.
CPC .......... *H01S 5/02375* (2021.01); *H01S 5/141* (2013.01); *H01S 5/4012* (2013.01); *H01S 5/4062* (2013.01); *H01S 5/4087* (2013.01)

(58) Field of Classification Search
CPC .... H01S 5/02375; H01S 5/4012; H01S 5/141; H01S 5/4062; H01S 5/4087
See application file for complete search history.

(56) References Cited

U.S. PATENT DOCUMENTS

| 6,192,062 | B1* | 2/2001 | Sanchez-Rubio ..... | H01S 5/4062 |
| | | | | 372/98 |
| 6,868,099 | B1* | 3/2005 | Walker .................... | H01S 5/141 |
| | | | | 372/18 |
| 8,565,275 | B2* | 10/2013 | Pushkarsky ........... | H01S 5/4025 |
| | | | | 327/4 |
| 2010/0193710 | A1 | 8/2010 | Wakabayashi et al. | |
| 2013/0148674 | A1 | 6/2013 | Nowak et al. | |
| 2013/0177033 | A1* | 7/2013 | Muro ........................ | H01S 5/06 |
| | | | | 372/20 |
| 2015/0349492 | A1* | 12/2015 | Muro ...................... | H01S 5/143 |
| | | | | 372/20 |
| 2019/0273365 | A1* | 9/2019 | Zediker ............. | H01S 3/094053 |
| 2020/0241313 | A1* | 7/2020 | Zhou ........................ | G02B 7/14 |

FOREIGN PATENT DOCUMENTS

| JP | 2010-171375 A | 8/2010 |
| JP | 2012-182434 A | 9/2012 |
| JP | 2017-228792 A | 12/2017 |
| JP | 2018-088499 A | 6/2018 |
| WO | WO-2011/081212 A1 | 7/2011 |
| WO | WO-2014/046161 A1 | 3/2014 |

* cited by examiner

*Primary Examiner* — Kinam Park
(74) *Attorney, Agent, or Firm* — Foley & Lardner LLP

(57) ABSTRACT

An external cavity laser module is configured to emit a laser beam and includes: a collimation laser light source having a Littrow configuration; a diffraction grating configured to selectively reflect and transmit light of a specific wavelength; a support member supporting the collimation laser light source and the diffraction grating; and a base rotatably supporting the support member to correct an axial direction of the laser beam emitted from the external cavity laser module.

12 Claims, 8 Drawing Sheets

LIGHT SOURCE DEVICE AND EXTERNAL CAVITY LASER MODULE

CROSS-REFERENCE TO RELATED APPLICATION

This application claims priority to Japanese Patent Application No. 2019-107917 filed on Jun. 10, 2019, the entire contents of which are hereby incorporated by reference.

BACKGROUND

The present disclosure relates to a light source device that performs wavelength beam combining, and an external cavity laser module for use in the light source device.

High-power and high-radiance laser beams are used for performing processing such as cutting, punching, or marking for various kinds of materials, or welding a metal material. Some of the carbon dioxide gas laser devices and YAG solid laser devices that have been used for such laser processing are being replaced by fiber laser apparatuses, which have a high efficiency of energy conversion. Laser diodes (hereinafter referred to as LD) are used for pumping light sources of fiber lasers. According to increase in output of LDs in the recent years, techniques using LDs for light sources of a laser beam that directly irradiates a material to process the material, instead of using LDs for pumping light sources, have been studied. Such techniques are referred to as "direct diode laser (DDL) technology."

U.S. Pat. No. 6,192,062 describes an example of a light source device configured to combine a plurality of laser beams of different wavelengths emitted from respective ones of a plurality of LDs to increase the optical output power. Coaxially combining a plurality of laser beams of respective wavelengths is referred to as "wavelength beam combining (WBC)" or "spectral beam combining (SBC)," and may be used for, for example, enhancing the optical output power and radiance of a DDL system or the like.

SUMMARY

When a plurality of laser beams are combined using wavelength beam combining to obtain a combined beam, misalignment of the laser beams may deteriorate the beam quality of the combined beam. There is a demand for a light source device in which such deterioration in beam quality is reduced.

A light source device according to one embodiment of the present disclosure includes: a plurality of external cavity laser modules configured to emit a plurality of laser beams of different peak wavelengths, each of the plurality of external cavity laser modules configured to emit a respective one of the plurality of laser beams; and a beam combiner configured to coaxially combine the plurality of laser beams to generate a wavelength-combined beam. Each of the plurality of external cavity laser modules includes a collimation laser light source having a Littrow configuration, and a diffraction grating configured to selectively reflect and transmit light of a predetermined wavelength. The plurality of external cavity laser modules are arranged so that the plurality of laser beams are incident at different angles on a same region of the beam combiner. Each of the plurality of external cavity laser modules includes: a support member supporting the collimation laser light source and the diffraction grating; and a base rotatably supporting the support member to correct an axial direction of a laser beam emitted from a respective one of the plurality of external cavity laser modules.

An external cavity laser module according one embodiment of the present disclosure is configured to emit a laser beam and includes: a collimation laser light source having a Littrow configuration; a diffraction grating configured to selectively reflect and transmit light of a specific wavelength; a support member supporting the collimation laser light source and the diffraction grating; and a base rotatably supporting the support member to correct an axial direction of the laser beam emitted from the external cavity laser module.

Certain embodiments of the present disclosure allows for providing a light source device in which deterioration in beam quality is reduced, and an external cavity laser module for the light source device.

DETAILED DESCRIPTION

Before describing embodiments of the present disclosure, findings that were made by the inventors and the technological background thereof will be described.

Figure 1:
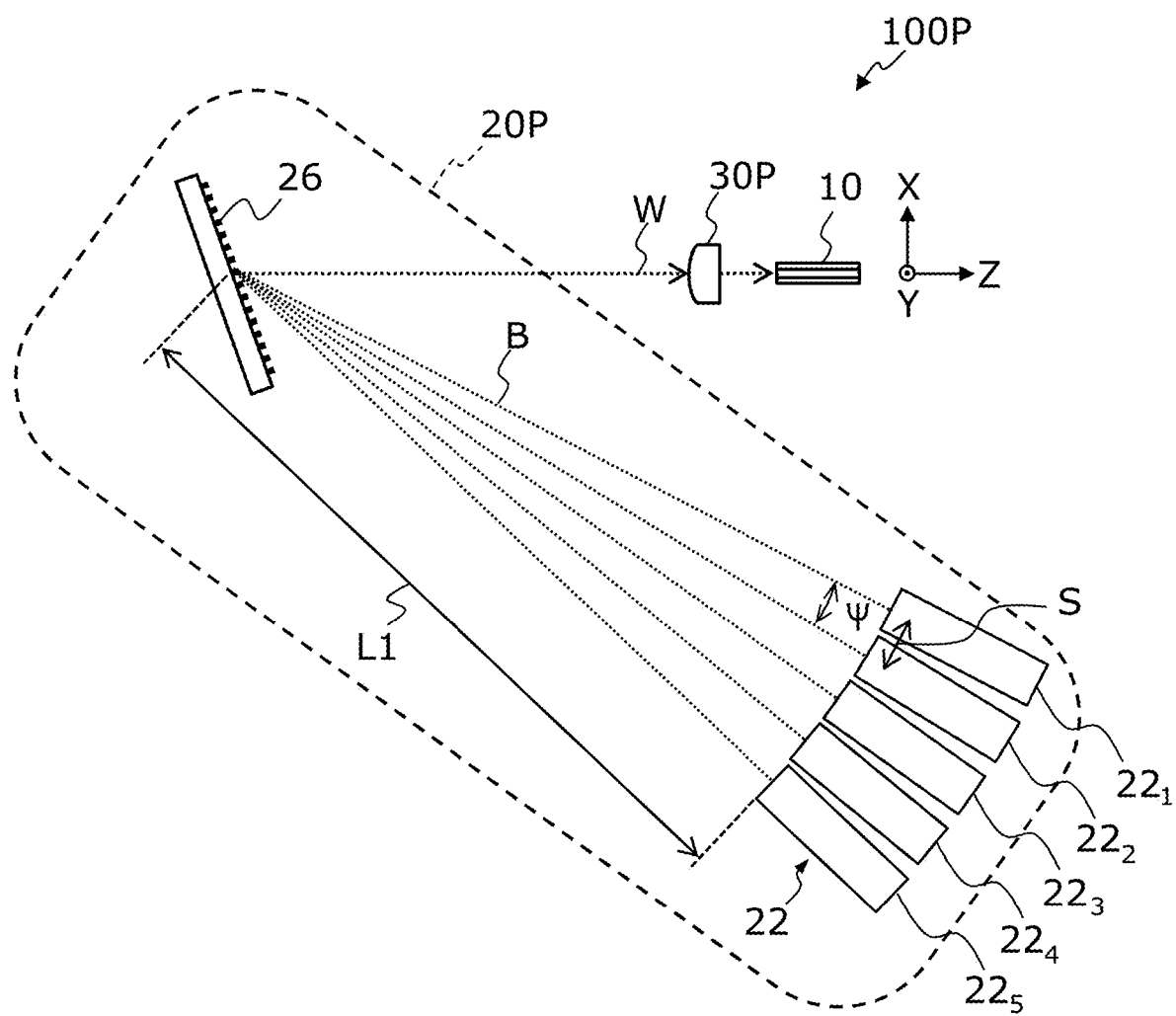
FIG. 1 is a diagram schematically showing an example of the structure of a light source device 100P in which laser beams that have been combined through wavelength beam combining are focused onto an optical fiber 10.

An example of a basic structure of a light source device configured to perform "wavelength beam combining (WBC)" will be described below. FIG. 1 is a diagram showing an example of a structure of a light source device in which laser beams that have been combined using WBC onto an optical fiber are focused. For reference, an XYZ coordinate system having an X axis, a Y axis, and a Z axis, which are orthogonal to one another, is schematically shown in the drawings including FIG. 1.

The light source device 100P shown in FIG. 1 includes an optical fiber 10, a beam light source 20P, and an optical coupling device 30P. The beam light source 20P coaxially combines a plurality of laser beams B of different peak wavelengths $\lambda$ to generate and emit a wavelength-combined beam W. In the present disclosure, the term "wavelength-combined beam" refers to a laser beam in which a plurality of laser beams B of different peak wavelengths $\lambda$ are coaxially combined using WBC. With the WBC technique, n laser beams of different peak wavelengths $\lambda$ are coaxially combined, so that not only the optical output power but also the power density (unit: $W/cm^2$) can be increased to about n times the power density of each individual laser beam B.

In the example shown in FIG. 1, the beam light source 20P includes a plurality of laser modules 22 configured to emit a plurality of laser beams B of different peak wavelengths $\lambda$, and a beam combiner 26 configured to combine the plurality of laser beams B to generate a wavelength-combined beam W. FIG. 1 illustrates five laser modules $22_1$ through $22_5$.

In the example shown in FIG. 1, the beam combiner 26 is a reflection-type diffraction grating. Components other than a diffraction grating may be employed for the beam combiner 26, and another wavelength-dispersion optical element such as a prism may be employed for the beam combiner 26. The laser beams B are incident on the reflection-type diffraction grating at different angles, and all of minus-first order reflection-diffracted light of the laser beams B are emitted in the same direction. In FIG. 1, for simplicity, the center axis of each laser beam B and the center axis of the wavelength-combined beam W are illustrated to indicate each laser beam B and the wavelength-combined beam W. The wavelength-combined beam W emitted from the beam light source 20P is focused by the optical coupling device 30P, and is incident on the core of the optical fiber 10.

In the example of FIG. 1, the Y axis is parallel with the viewing direction of FIG. 1, and FIG. 1 schematically shows a view parallel to the XZ plane of the light source device 100P. The propagation direction of the wavelength-combined beam W is parallel to the Z axis direction.

As used herein, the distance from each laser module 22 to the reflection-type diffraction grating (beam combiner 26) is indicated by L1, and the angle between two adjacent laser modules 22, i.e., the angle between two adjacent laser beams B, is indicated by $\Psi$ (radian: rad). In the example shown in FIG. 1, the distance L1 and the angle $\Psi$ are uniform among the laser modules $22_1$ through $22_5$. Assuming that the arrangement interval (intervals between emitters) of the laser modules 22 is S, an approximate expression $\Psi \times L1 = S$ holds true.

Figure 2:
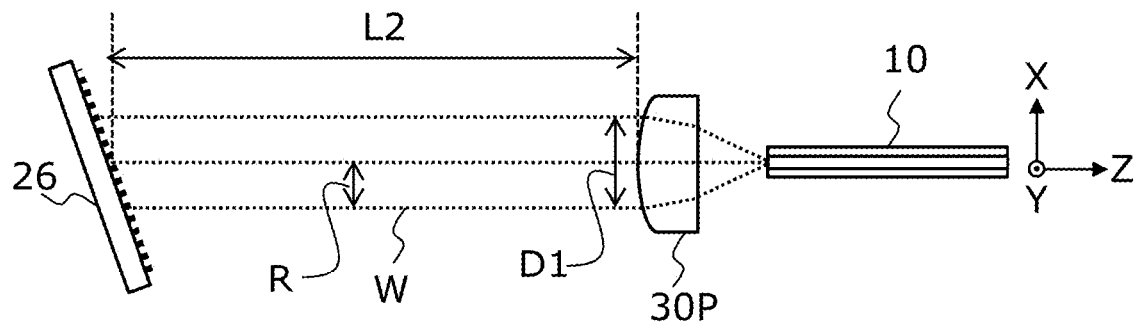
FIG. 2 is a diagram schematically showing focusing of a wavelength-combined beam W onto an optical fiber 10 by an optical coupling device 30P.

FIG. 2 is a diagram schematically showing a wavelength-combined beam W emitted from the beam combiner 26 and focused by the optical coupling device 30P onto the core of the optical fiber 10. One example of the optical coupling device 30P is a converging lens. For simplicity, the wavelength-combined beam W is schematically represented by three rays. Among the three rays, the middle ray is on the optical axis of the lens, while the other two rays schematically represent positions that would together define the beam diameter. The beam diameter can be defined by the size of a region having an optical intensity of, e.g., $1/e^2$ or more relative to the optical intensity in the beam center. Herein, "e" is Napier's constant (about 2.71). The beam diameter and the beam radius may alternatively be defined according to other criteria.

In FIG. 2, the wavelength-combined beam W is illustrated as a parallel collimated beam, and a diameter (incident beam diameter) of the wavelength-combined beam W along the X axis direction in a region incident on the optical coupling device 30P is denoted as D1. In actuality, however, the wavelength-combined beam W propagating along the Z axis direction is not perfectly parallel light. The beam radius R of the wavelength-combined beam W is not uniform, but rather is a function of position on the optical path (i.e., the coordinate value z on the Z axis) or optical path length. Moreover, the size of the beam radius R of the wavelength-combined beam W may be varied in the Y axis direction and the X axis direction. Therefore, in a strict sense, it would be appropriate to denote a beam radius of the wavelength-combined beam W along the Y axis direction as $R_y(z)$ and a beam radius of the wavelength-combined beam W along the X axis direction as $R_x(z)$. Because the wavelength-combined beam W results from coaxial and spatial overlapping of the individual laser beams B, the beam radius R and the divergence half angle $\theta$ of the wavelength-combined beam W can be approximated as the beam radius w and the divergence half angle $\theta$, respectively, of the individual laser beam B emitted from each laser module 22.

In FIG. 2, the distance between the reflection-type diffraction grating (beam combiner 26) and the optical coupling device 30P is denoted as L2. The distance L2 may be in a range of 100 to 500 mm, for example. Moreover, the distance L1 shown in FIG. 1 is, e.g., about 2000 mm or more. The angle $\Psi$ and pitch S that define the distance L1 are restricted by the wavelength of the laser beam B, the structure and performance of the beam combiner 26, structure and size of each laser module 22, etc., and thus are difficult to be substantially reduced. Hereinafter, L1+L2 may be referred to as the "optical path length."

According to a study by the inventors, assembly variations may cause variation in the direction of the laser beams B each of which is emitted from a respective one of the laser modules 22, so that it is difficult for the laser beams B to be incident on the same region of the beam combiner 26 at desired angles (with angular intervals of e.g. 1 degree or less). This is due to the fact that, as will be described below in detail, each laser module 22 includes a plurality of optical elements, such as a semiconductor laser device in a chip form, a diffraction grating (wavelength selection element) for external resonance, and a collimator lens, that are disposed on an optical path of each laser module 22. When a semiconductor laser device in chip form is mounted inside a package, the orientation or position of the mounted semiconductor laser device may be varied. Such variations may herein be referred to as "mounting variations." Moreover, when the package, the diffraction grating, and optical elements such as the collimator lens are assembled, their respective angles or positions, etc., may be varied. In the present specification, such variations including mounting variations may be collectively referred to as "assembly variations."

In the example shown in FIG. 1, the laser beams B emitted from the plurality of laser modules 22 are incident on the same region of the beam combiner 26. However, if the assembly variations described above occurs, it is difficult for the plurality of laser beams B to be incident on the same region of the beam combiner 26. When the plurality of laser beams B are incident at different positions of the beam combiner 26, the beam quality of the wavelength-combined beam W may deteriorate. Deterioration in the beam quality may result in that the optical coupling device 30P being unable to focus the wavelength-combined beam W in a sufficiently small spot.

Certain embodiments of the present disclosure allow for reducing or preventing deterioration in the beam quality of the wavelength-combined beam W, which is associated with assembly variations.

Basic Structure of Laser Module According to the Present Disclosure

Figure 3:
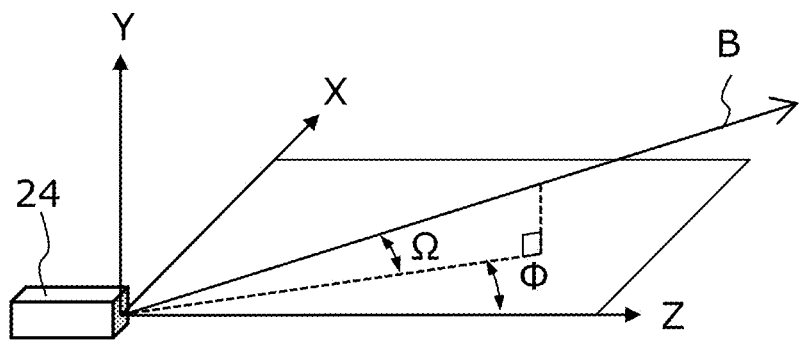
FIG. 3 is a perspective view schematically showing a direction of a laser beam B emitted from a laser module 24.
Figure 4A:
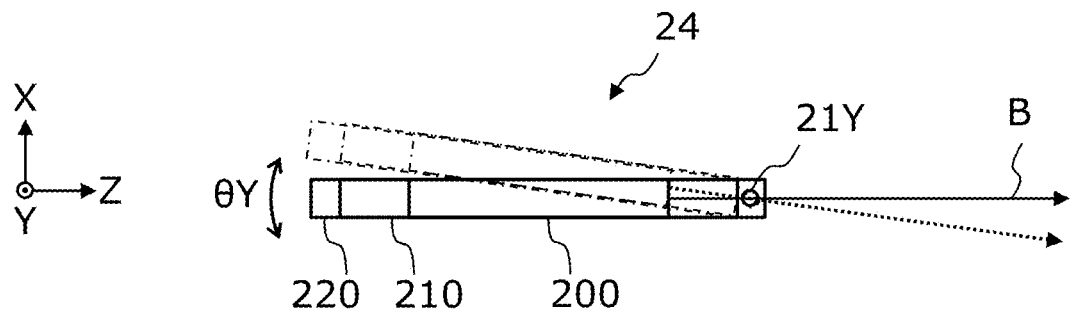
FIG. 4A is a top view schematically showing an example of the structure of the laser module 24 in an XZ plane.
Figure 4B:
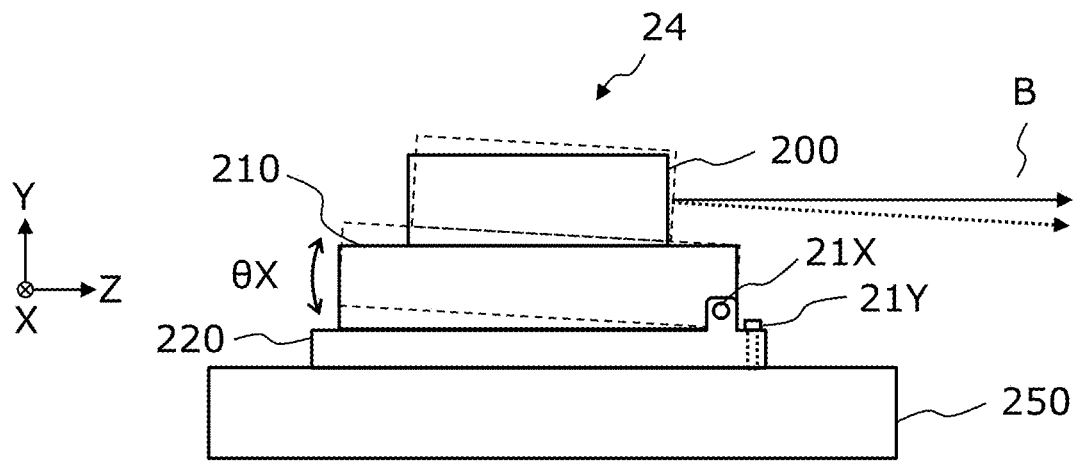
FIG. 4B is a side view schematically showing an example of the structure of the laser module 24 in a YZ plane.

With reference to FIG. 3 and FIGS. 4A and 4B, an example of the basic structure of a laser module 24 included in a light source device according to the present disclosure will be described. FIG. 3 is a perspective view schematically showing the direction of a laser beam B emitted from a laser module 24. FIG. 4A is a top view schematically showing an example of the structure of the laser module 24 in the XZ plane. FIG. 4B is a side view schematically showing an example of the structure of the laser module 24 in the YZ plane.

In the example of FIG. 3, it is assumed that the laser beam B is expected to propagate in parallel to the Z axis. However, the propagation direction of the laser beam B is inclined with respect to the Z axis. In FIG. 3, the inclination (i.e., an offset in the beam direction) of the laser beam B is exaggerated for ease of explanation. In the XZ plane, the laser beam B is rotated with respect to the positive direction of the Z axis by an azimuth angle $\Phi$ in the positive direction of the X axis, and rotated with respect to the XZ plane by an elevation angle $\Omega$ in the positive direction of the Y axis. It is ideal that the azimuth angle $\Phi$ and the elevation angle $\Omega$ are zero or close to zero. However, due to assembly variations occurring at the time of assembling the laser module 24, azimuth angle $\Phi$ and elevation angle $\Omega$ may not be zero. For example, deviation of the position of a collimator lens inside the laser module 24 by 1 µm from a predetermined position along the Y axis direction may result in an elevation angle $\Omega$ of, for example, 0.1 degrees. Although 0.1 degrees may be a small value, when the optical path is longer, the positional offset of the laser beam B is increased in proportion to the length of the optical path. In the light source device 100P of FIG. 1, the length of the optical path, i.e., the distance L1, is about 2000 mm or more, and accordingly an angular offset of about 0.1 degrees that has occurred in the laser beam B may result in an offset of 3.5 mm or more in the irradiated position on the beam combiner 26.

The laser module 24 according to one embodiment of the present disclosure, as shown in FIG. 4A and FIG. 4B, includes an external-cavity laser light source 200, a support member 210 that supports the laser light source 200, and a base 220 that rotatably supports the support member 210 to correct the axial direction of the laser beam B. As shown in FIG. 4B, the laser module 24 is disposed on a pedestal 250. As will be described below, the laser light source 200 includes a collimation laser light source having a Littrow configuration, and a diffraction grating (wavelength selection element) configured to selectively reflect and transmit light of a predetermined wavelength.

Each of the support member 210 and the base 220 has a longitudinal axis extending along the direction in which the laser beam B is emitted. However, as described above, the direction in which the laser beam B is emitted may not be perfectly parallel to the longitudinal axis, but may be slightly inclined with respect to the longitudinal direction due to assembly variations. For ease of explanation, it is assumed that the base 220 is secured to the pedestal 250 so that the longitudinal axes of the support member 210 and the base 220 coincide with the Z axis. It is assumed that the Y axis extends in the vertical direction, and that the XZ plane is horizontal. In one embodiment, the support member 210 may have a length of 80 mm or more along a longitudinal axis of the support member 210, and may have a width of 12 mm or less along a horizontal direction, which is a direction orthogonal to the longitudinal axis, of the support member 210.

In the present disclosure, the support member 210 is rotatably supported by the base 220 in "biaxial" directions. More specifically, the support member 210 can be rotated around the vertical axis that is parallel to the Y axis, and the horizontal axis that is parallel to the X axis, within an angular range of e.g. ± 1 degree relative to the pedestal 250. In the description below, a rotation around the vertical axis, which is parallel to the Y axis, will be referred to as "$\theta Y$ rotation," while a rotation around the horizontal axis, which is parallel to the X axis, will be referred to as "$\theta X$ rotation." A $\theta Y$ rotation of the support member 210 allows the azimuth angle $\Phi$ of the laser beam B (shown in FIG. 3) to be corrected, and a $\theta X$ rotation of the support member 210 allows the elevation angle $\Omega$ of the laser beam B to be corrected. Such "$\theta Y$ rotation" and "$\theta X$ rotation" can be performed by a first adjustment mechanism 21Y and a second adjustment mechanism 21X, respectively, that are included in the laser module 24. In other words, the first adjustment mechanism 21Y connects the base 220 to the pedestal 250 such that the longitudinal axis of the base 220 is rotatable around the vertical axis relative to the pedestal 250. The second adjustment mechanism 21X connects the support member 210 to the base 220 such that the longitudinal axis of the support member 210 is rotatable around the horizontal axis relative to the base 220. In other words, the first adjustment mechanism 21Y and the second adjustment mechanism 21X restrict a movement of the support member 210 with respect to the base 220 other than a rotation of the support member 220 with respect to the base 220. Each of the first adjustment mechanism 21Y and the second adjustment mechanism 21X has a width along the horizontal direction (size along the $X_1$ axis direction) equal to or less than a width along the horizontal direction (size along the $X_1$ axis direction) of the support member 210.

As shown in FIG. 4A, a $\theta Y$ rotation can be caused, for example, using a hinge disposed near one end of the base 220 and serving as a pivotal axis (rotation shaft). As shown in FIG. 4B, a $\theta X$ rotation can be caused using a hinge disposed near one end of the support member 210 and serving as a pivotal axis (rotation shaft). In the example shown in FIGS. 4A and 4B, the adjustment mechanisms 21X and 21Y are disposed at positions closer to an end (tip portion) of the base 220 or the support member 210 along the longitudinal axis than a center of the base 220 or the support member 210 along the longitudinal axis. Employing such a structure allows for performing angular adjustment with a small resolution (high resolution). The adjustment mechanisms 21X and 21Y may have structures other than those described in this example. For example, a structure using a small-sized actuator, e.g., a stepping motor or a piezoelectric motor, a leaf spring, or the like can be used for the adjustment mechanisms 21X and 21Y.

Figure 5:
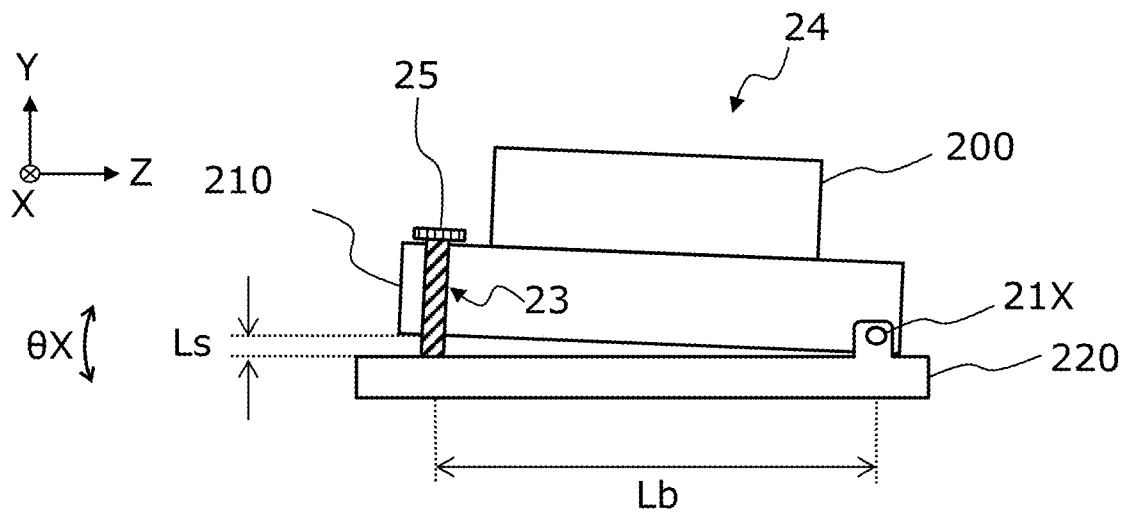
FIG. 5 is a schematic diagram showing an example of a structure with θX rotation of the support member 210

FIG. 5 is a schematic diagram showing an example of a structure configured to perform $\theta X$ rotation of the support member 210. The support member 210 has a screw hole 23, in which a screw 25 is inserted to function as a fixing device. The interval or angle between the support member 210 and the base 220 is defined by a length Ls of a portion of the screw 25 that protrudes downward from the support member 210. The distance between the hinge (second adjustment mechanism 21X) and the screw 25 is indicated as Lb. The angle θX (unit: radian)×distance Lb is approximately equal to the length Ls of the portion of the screw 25 protruding downward from the support member 210. In other words, an approximate expression Ls=θX×Lb holds true. This equation may be transformed to θX=Ls/Lb. An example will be considered where a single turn of the screw 25 changes the length Ls by 0.1 mm, for example. When the distance Lb is 100 mm, a single turn of the screw 25 changes the angle of θX rotation by about 0.1/100 radians (=1 milliradian). As can be understood from this, the longer the distance Lb is, the finer angle adjustments can be facilitated.

With the adjustment mechanisms 21X and 21Y described above, after a plurality of laser modules 24 are arranged, for example, as shown in FIG. 1, the orientation of the support member 210 included in each individual laser module 24 can be can be finely adjusted through biaxial rotation. Accordingly, the plurality of laser beams B can be incident on the same region of the beam combiner 26 at predetermined angles.

EMBODIMENT

Light Source Device

FIG. 4 is a diagram schematically showing an example of the structure of a light source device 100 according to one embodiment of the present disclosure. The light source device 100 shown in FIG. 4 includes an optical fiber 10, a beam light source 20, and an optical coupling device 30. The beam light source 20 is configured to coaxially combine a plurality of laser beams B of different peak wavelengths λ to generate and emit a wavelength-combined beam W. Details of the optical coupling device 30 will be described below with reference to FIG. 14.

The beam light source 20 includes a plurality of laser modules 24 each of which is configured to emit a respective one of a plurality of laser beams B, and a beam combiner 26 configured to combine the plurality of laser beams B to generate the wavelength-combined beam W. The laser module 24 according to the present embodiment includes a structure as schematically described above. A more specific structure of the laser module 24 will be described below.

Figure 6:
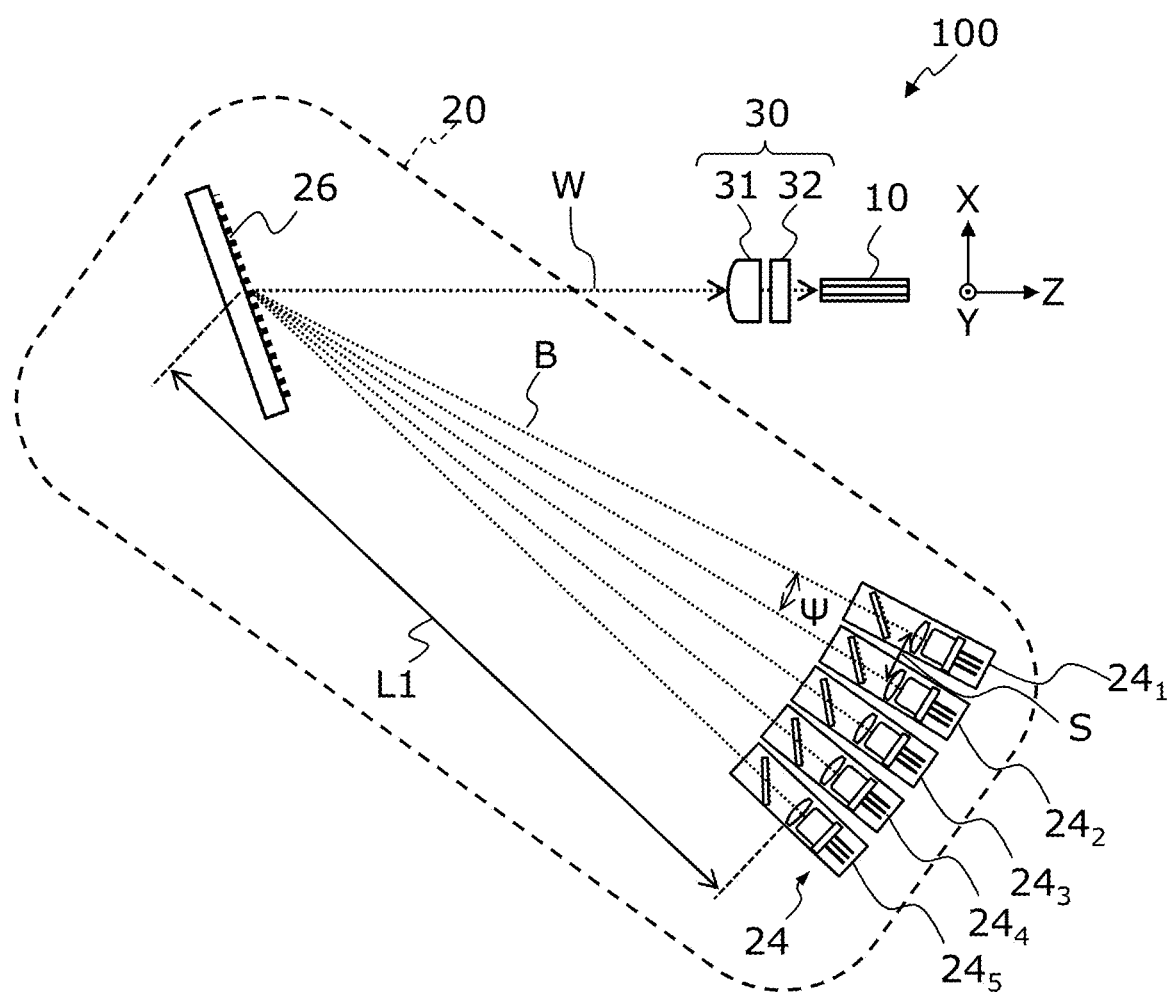
FIG. 6 is a diagram schematically showing an example of the structure of a light source device 100 according to one embodiment of the present disclosure.

FIG. 6 shows five laser modules $24_1$ to $24_5$. The laser modules $24_1$ to $24_5$ are configured to emit laser beams B of peak wavelengths $\lambda_1$ to $\lambda_5$, respectively. Herein, the relationship $\lambda_1<\lambda_2<\lambda_3<\lambda_4<\lambda_5$ holds true. The number of laser modules 24 that are included in the beam light source 20 may be other than five, and, for example, six or more laser modules 24 may be employed.

In the present embodiment, the peak wavelengths of adjacent laser beams B differ by δλ ($\lambda_{n+1}-\lambda_n=\delta\lambda$), and the angle Ψ between adjacent laser beams B is, for example, about 0.4 degrees, i.e. about 7 milliradians (mrad). The interval between the peak wavelengths of the plurality of laser beams B is, for example, equal to or less than about 5 nm. Moreover, the arrangement pitch S of the laser modules 24 is about 10 millimeters (mm). When such examples of values are employed, from the approximate expression Ψ×L1=S, the distance L1 is determined to be about 1500 mm. In order to efficiently accommodate component elements in a limited space, one or more mirrors may be disposed between the beam combiner 26 and a corresponding one or more of the laser modules 24, and the propagation direction of each laser beam B may be rotated using the one or more mirrors.

Figure 7:
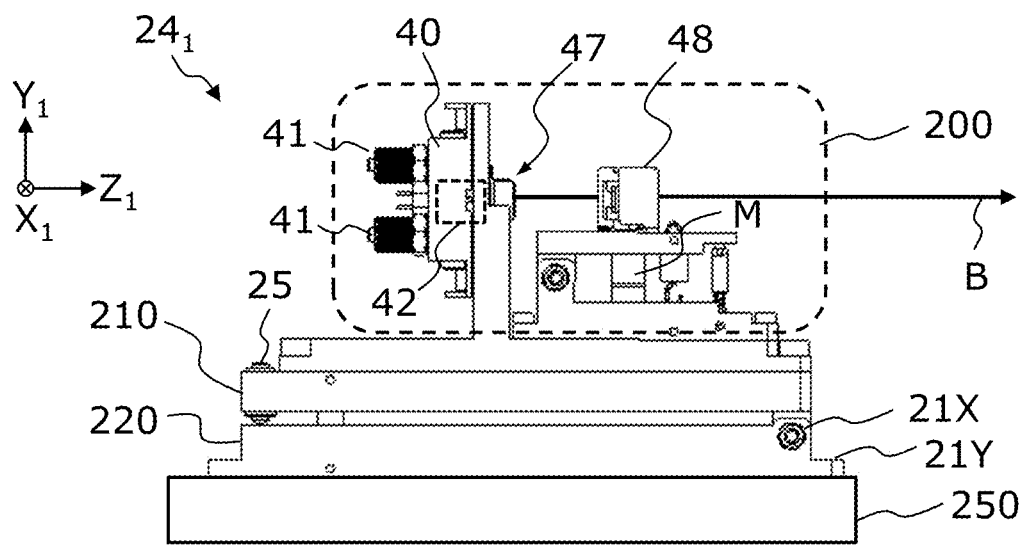
FIG. 7 is a side view schematically showing an example of a structure of an external-cavity laser module $24_1$.
Figure 8:
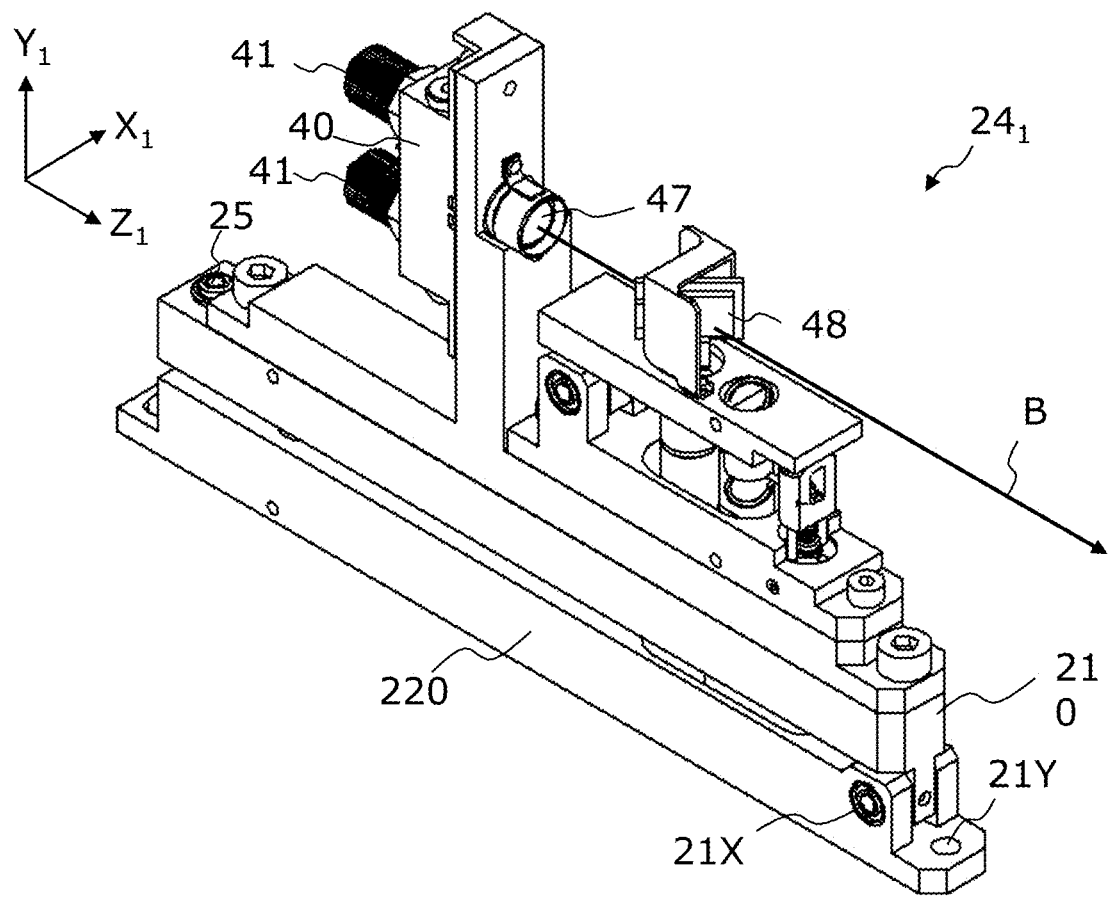
FIG. 8 is a perspective view schematically showing the example of a structure of the external-cavity laser module $24_1$.

Next, with reference to FIG. 7 and FIG. 8, a specific example of the structure of the external cavity laser modules 24 will be described. FIG. 7 is a schematic side view showing one example of the structure of the external cavity laser module $24_1$, and FIG. 8 is a schematic perspective view thereof. The other external cavity laser modules $24_2$ to $24_5$ have structures similar to that of the external cavity laser module $24_1$. For reference, an $X_1Y_1Z_1$ coordinate system having an $X_1$ axis, a $Y_1$ axis, and a $Z_1$ axis that are orthogonal to one another is schematically shown in FIG. 7 and FIG. 8. This $X_1Y_1Z_1$ coordinate system defines local coordinates for the laser module $24_1$. Although it would be convenient if the origin of the $X_1Y_1Z_1$ coordinate system were illustrated at a position that coincides with the origin of the laser beam B in the laser module $24_1$, the origin of the $X_1Y_1Z_1$ coordinate system is depicted at a location spaced apart from the origin of the laser beam B for ease of illustration. The $Z_1$ axis is parallel to the propagation direction (beam center axis) of the laser beam B.

In the example shown in FIG. 7 and FIG. 8, the laser module $24_1$ includes: an external-cavity laser light source 200; a support member 210 supporting the laser light source 200; and a base 220 supporting the support member 210 rotatably around a horizontal axis parallel to the $X_1$ axis to allow correction of the axial direction of the laser beam B. Moreover, the base 220 is placed on a pedestal 250. More specifically, the base 220 is supported by the pedestal 250 rotatably around a vertical axis that is parallel to the $Y_1$ axis. The pedestal 250 is made of a metal such as a stainless steel or aluminum, for example. The laser module $24_1$ has a size along the $X_1$ axis direction smaller than its size along the $Y_1$ axis direction and smaller than its size along the $Z_1$ axis direction. If the size of the laser module $24_1$ along the $X_1$ axis direction is excessively large, it may be difficult to arrange the plurality of laser modules 24 with a narrow angular pitch, as shown in FIG. 6. The size of the laser module $24_1$ along the $X_1$ axis direction may be, for example, 12 mm or less.

In the example shown in FIG. 7 and FIG. 8, the laser module $24_1$ has a shape and a size that can be accommodated in a rectangular-parallelepiped space having a size of, e.g., 12 mm or less along the $X_1$ axis direction. Therefore, a multitude of laser modules 24 can be arranged within a limited space without interfering one another. Moreover, the size of the rectangular-parallelepiped space along the $Z_1$ axis, which is defined by the support member 210 and the base 220, is larger than the size of the laser light source 200 along the $Z_1$ axis. The size (length) of the support member 210 along the $Z_1$ axis may be 80 mm or more. Thus, when the support member 210 has a longitudinal axis extending in a direction that is parallel to the axial direction of the laser beam B, it is possible to increase accuracy of adjustment using the θY rotation and the θX rotation, as has been described above.

It might be possible to employ a mirror or a prism to deflect each individual laser beam B in a desired direction to correct the laser beam B without employing the mechanism according to one embodiment of the present disclosure. However, when performing such beam deflection, the size of the laser module $24_1$ along the $X_1$ axis direction may be increased to, e.g., 15 mm or more, so that it is difficult for a multitude of laser modules 24 to be arranged in a limited space.

The laser light source 200 includes a collimation laser light source 47 having a Littrow configuration and a diffraction grating 48 configured to selectively reflect and transmit light of a predetermined wavelength. The diffraction grating 48 functions as a wavelength selection element, and therefore may also be referred to as a "wavelength-selective diffraction grating." Hereinafter, an example of a basic structure of the laser light source 200 will be described.

Figure 9:
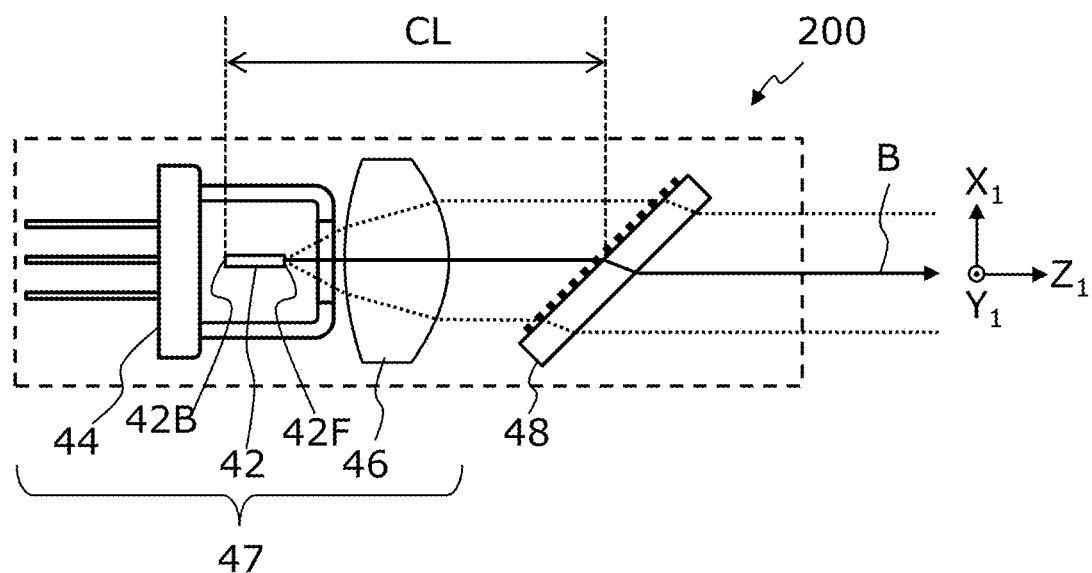
FIG. 9 is a cross-sectional view schematically showing an example of the structure of a laser light source 200 used in one embodiment.

A description with reference to FIG. 9 will be given below. FIG. 9 is a cross-sectional view showing a main structure of the laser light source 200. The laser light source 200 in FIG. 9 has an external-cavity structure that includes a laser diode 42 as a light source or an optical gain element (gain medium). Hereinafter, a laser diode will be referred to as an "LD." A system in which the lasing frequency of an LD is adjusted using such an external cavity is referred to as an "ECLD (External-Cavity Laser Diode)" or an "ECD (External-Cavity Diode Laser)."

In one embodiment of the present disclosure, the LD 42 may be mounted in a semiconductor laser package (hereinafter referred to as a "package") 44 that is sealed airtight. The package 44 includes a stem having a lead terminal and a metal cap covering the LD 42 that has been fixed to the stem, with a light-transmitting window member being attached to the metal cap. Any appropriate structure may be employed for the package 44, and for example, the package 44 may be a TO-CAN type package of e.g., Φ5.6 mm or Φ9 mm. One example of the window member is a thin plate made of optical glass (refractive index: 1.4 or more). The inside of the package 44 can be filled with an inert gas, e.g., a nitrogen gas of high cleanliness or a noble gas, so that the package 44 can be sealed airtight. In general, if an LD 42 that emits a laser beam of a wavelength that is shorter than the near-infrared region are employed and their optical output power is increased, dust or the like in the ambient may adhere to the emitter region during operation due to optical dust attraction effect, which may reduce the optical output power. Other substance may also adhere to the emitter region, and a deposit generated by chemical reaction of volatilized organic matter with the laser beam may adhere to the emitter region. The shorter the wavelength of the laser beam is and the higher the optical output power is, the greater the deterioration associated with adhering substance is. In order to avoid such reduction in the optical output power, when accommodating the plurality of LDs 42 in a housing of the light source device 100, the housing may be assembled such that dust does not enter the housing, and then the housing may be sealed. However, there may be cases in which dust or the like adheres to the lens structure, diffraction gratings, or other parts that are necessary for wavelength beam combining, and also it is difficult to enhance airtightness of the entirety of the housing. In the present embodiment, each LD 42 is accommodated in a respective sealed semiconductor laser package. Technology for packaging LDs has been advanced, which allows highly reliable operation over long periods of time.

Examples of the LD 42 include a semiconductor laser element configured to emit near-ultraviolet, violet, blue, or green laser light and made of, for example, a nitride semiconductor-based material. The LD 42 may be secured to the stem via a submount having a high thermal conductivity. The LD 42 may be oriented in a direction other than the example shown in the drawings, and the LD 42 may be oriented such that laser light therefrom is reflected along the Z axis direction by a mirror in the package 44.

Figure 10:
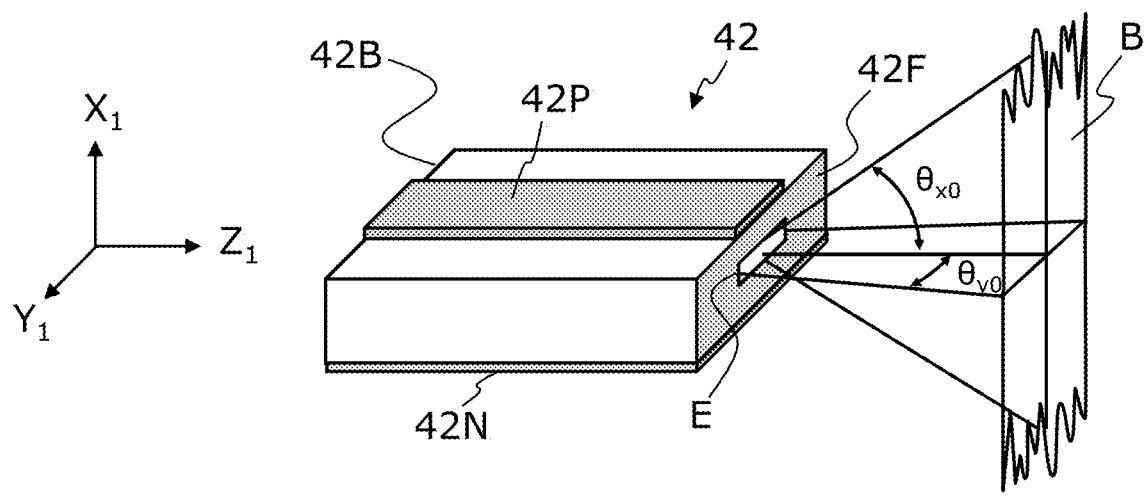
FIG. 10 is a perspective view schematically showing an example of a basic structure of an LD 42.

FIG. 10 is a perspective view schematically showing an example of a basic structure of the LD 42. The structure shown in FIG. 10 is simplified for description. In the example of FIG. 10, the LD 42 includes a stripe-shaped p-electrode 42P having a strip shape on an upper surface of the LD 42, an n-electrode 42N on a lower surface of the LD 42, and an emitter region E located on a first end surface 42F of the LD 42. The laser beam B is emitted from the emitter region E. The LD 42 includes a semiconductor substrate and a plurality of semiconductor layers (a semiconductor multilayer structure) that are grown on the semiconductor substrate. The semiconductor multilayer structure includes an emission layer, and may have various known structures. In this example, the emitter region E has a size along the $Y_1$ axis direction, that is, a $Y_1$-axis size, (e.g. about 15 μm) much larger than a size of the emitter region E along the $X_1$ axis direction, that is, an $X_1$-axis size (e.g. about 1.5 μm). The $X_1$-axis size of the emitter region E is defined by the semiconductor multilayer structure (more specifically, thicknesses of the waveguide and the cladding layers, refractive index ratio, etc.) of the LD 42. The $Y_1$-axis size of the emitter region E is defined by the $Y_1$-axis size of a region in which an electric current flows in a direction across the emission layer, more specifically, by the width (gain waveguide width) of a ridge structure (not shown) or the like.

The first end surface 42F of the LD 42 according to the present embodiment is provided with an antireflection coating. A second end surface 42B of the LD 42 is provided with a high-reflectance film. Accordingly, the region indicated by a distance CL in FIG. 9 forms a cavity, and the distance CL defines the cavity length. As will be described below, a portion of the laser beam B emitted from the LD 42 is diffracted by a transmission diffraction grating 48 and returns to the LD 42. A standing wave of a single longitudinal mode having a predetermined wavelength is generated between the high-reflectance film on the second end surface 42B of the LD 42 and the transmission diffraction grating 48. A portion of the cavity that is located outside the LD 42 is referred to as an "external cavity." The configuration shown in FIG. 9 is a Littrow configuration. A Littrow configuration does not need a mirror, which would be required in a Littman configuration, which is not shown. With a Littrow configuration having the transmission diffraction grating 48, the cavity length CL can be reduced, and it is easier to stabilize the resonance mode. In the present embodiment, the cavity length CL is in a range of 25 to 35 mm, for example.

As shown in FIG. 10, the beam shape in the $X_1$ axis direction of the laser beam B emitted from the emitter region E and the beam shape in the $Y_1$ axis direction of the laser beam B emitted from the emitter region E are asymmetric. A far field pattern of the laser beam B is schematically shown in FIG. 10. The laser beam B has a beam shape that approximates a single-mode Gaussian beam along the $X_1$ axis direction, and has a multi-mode beam shape with a small divergence angle as a whole along the $Y_1$ axis direction. The divergence half angle $\theta_{x0}$ along the $X_1$ axis direction is greater than the divergence half angle $\theta_{y0}$ along the $Y_1$ axis direction. In the $X_1$ axis direction, the laser beam B can be approximated as a Gaussian beam.

Therefore, given a beam radius $\omega_o$ at the beam waist along the $X_1$ axis direction and a wavelength λ of the laser beam B, then $\theta_{x0}=\tan^{-1}(\lambda/\Pi\omega_o)\approx\lambda/(\Pi\omega_o)$ radians holds true. In the case where λ is in the visible light region, $\theta_{x0}$ is, e.g., 20 degrees, and $\theta_{y0}$ is, e.g., 5 degrees. Accordingly, the $X_1$-axis size of the laser beam B increases, while relatively "rapidly" diverging, during propagation along the Z axis direction.

Thus, the $X_1$ axis is called "the fast axis," and the $Y_1$ axis "the slow axis." The laser beam B has a multi-mode beam shape along the slow-axis direction, and thus the beam quality along the slow-axis direction is reduced relative to the beam quality along the fast-axis direction. Accordingly, the Beam Parameter Product (BPP) indicating beam quality is relatively larger along the slow-axis direction, relative to that along the fast-axis direction. BPP is a multiplication product between the beam waist radius and the divergence half angle in a far field.

As used in the present disclosure, the terms "fast axis direction" and "slow axis direction," when referring to each individual LD 42, respectively refers to a $Y_1$ axis and an $X_1$ axis in an $X_1Y_1Z_1$ coordinate system for each LD 42. When referring to the wavelength-combined beam W, the terms "fast axis direction" and "slow axis direction" respectively refers to "the X axis direction" and "the Y axis direction" in a global XYZ coordinate system. In other words, in a cross section that is orthogonal to the propagation direction of a laser beam, the direction along which BPP is the lowest is referred to as "the fast axis," and the direction that is orthogonal to the fast axis is referred to as "the slow axis."

Referring again to FIG. 9, the laser light source 200 includes a collimator lens 46 configured to collimate a laser beam B that is emitted from the LD 42. The collimator lens 46 is an aspherical lens, for example. The laser beam B that has been transmitted through the collimator lens 46 is in the form of a bundle of approximately parallel rays, and is incident on the transmission diffraction grating 48.

Figure 11A:
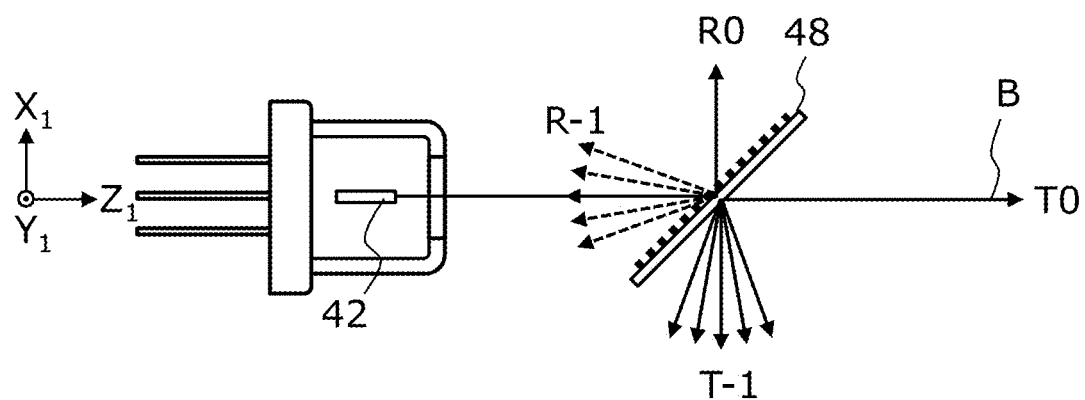
FIG. 11A is a cross-sectional view schematically showing an action of a transmission diffraction grating 48.
Figure 11B:
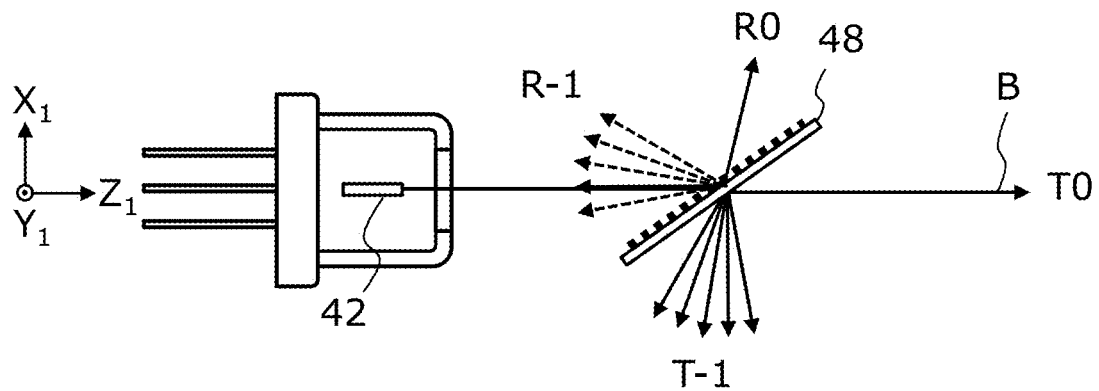
FIG. 11B is a cross-sectional view schematically showing an action of the transmission diffraction grating 48.

Each of FIG. 11A and FIG. 11B is a cross-sectional view schematically showing diffraction of the laser beam B by the transmission diffraction grating 48. A difference between FIG. 11A and FIG. 11B is the tilt angle of the transmission diffraction grating 48. In these figures, for simplicity, illustration of the collimator lens 46 is omitted, and the laser beam B and the diffracted light are also represented as straight lines.

The laser beam B is incident on the transmission diffraction grating 48 in the example in these drawings to obtain, mainly, 0th order transmission-diffracted light T0, 0th order reflection-diffracted light R0, minus-first order transmission-diffracted light T-1, and minus-first order reflection-diffracted light R-1. The minus-first order diffracted light T-1 and R-1 are emitted from the transmission diffraction grating 48 at different angles in accordance with their wavelengths. Of these diffracted light beams, the minus-first order reflection-diffracted light R-1 returns to the LD 42. When the Littman configuration described above is employed, the minus-first order reflection-diffracted light R-1 will be reflected by a mirror (not shown), and thereafter return to the LD 42 again through the transmission diffraction grating 48. Therefore, a Littman configuration may increase the cavity length, which may cause reduction in stability of the longitudinal mode.

In FIG. 11A and FIG. 11B, each of minus-first order diffracted light T-1 and R-1 is schematically indicated by five rays. These five rays are five imaginary minus-first order diffracted rays of mutually different wavelengths. In actuality, a single standing wave of the longitudinal mode will be formed within a cavity in which laser oscillation occurs, and only the diffracted ray(s) that has the wavelength of this standing wave will return to the LD 42 to contribute to laser oscillation. When the tilt angle of the transmission diffraction grating 48 changes, the wavelength of the minus-first order reflection-diffracted light R-1 to return to the LD 42 is shifted. Adjusting the tilt angle of the transmission diffraction grating 48 allows for selecting the wavelength of laser oscillation. Even when the tilt angle of the transmission diffraction grating 48 is constant, adjusting the grating pitch of the transmission diffraction grating 48 allows for obtaining similar effects.

In one example, the transmission diffraction grating 48 may be configured so that, with respect to a beam of a predetermined wavelength (e.g. about 410 nm) that is incident at a predetermined angle (40 to 50 degrees), a ratio of the 0th order transmission-diffracted light T0 is, e.g., about 50% or more, a ratio of the minus-first order reflection-diffracted light R-1 is, e.g., about 15%, and a ratio of a total of the 0th order reflection-diffracted light R0 and the minus-first order transmission-diffracted light T-1 is, e.g., about 10% or less.

As shown in FIG. 11A and FIG. 11B, the minus-first order reflection-diffracted light R-1 is oriented in different angles within the $X_1Z_1$ plane according to respective wavelengths. Therefore, the minus-first order reflection-diffracted light R-1 that are incident at different positions on an emission end surface of the laser diode 42 along the $X_1$ direction have respectively different wavelengths. As shown in FIG. 10, the emitter region E of the laser diode 42 has a relatively small size along the $X_1$ axis direction, as compared to a size of the emitter region E in the $Y_1$ axis direction. Therefore, the wavelength of the minus-first order reflection-diffracted light rays R-1 that is incident on the emitter region E has a very narrow width, so that the laser diode 42 can lase more stably in a single mode. If the laser diode 42 is rotated by 90° around the $Z_1$ axis so that the orientations of its fast axis and slow axis are reversed, the emitter region E will be disposed to be elongated along the $X_1$ axis. In that case, the minus-first order reflection-diffracted light R-1 incident on the emitter region E may have a broader range of wavelengths, and thus the laser diode 42 may be less likely to stably lase in a single mode.

Figure 12:
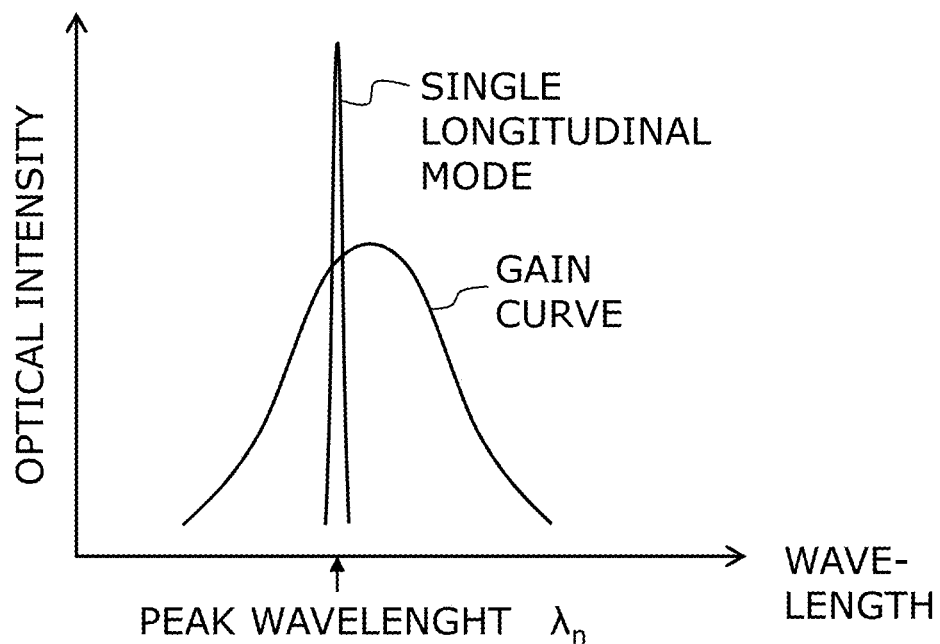
FIG. 12 is a diagram schematically showing a gain curve of the LD 42 and a spectrum of a laser beam B emitted from an external-cavity laser module 24 that is lasing in a single longitudinal mode at a certain wavelength $\lambda_n$.

FIG. 12 is a diagram schematically showing a gain curve (i.e., a curve representing wavelength dependence of gain) of the LD 42 and a spectrum of a laser beam B that is emitted from an external-cavity laser module 24 that is lasing in a single longitudinal mode at a certain wavelength $\lambda_n$. The wavelength (peak wavelength $\lambda_n$) of the laser beam B is selected from a wavelength range with a gain that allows laser oscillation. With the external-cavity structure, the laser beam B has a narrow spectral width, exhibiting a sharp peak.

According to one embodiment of the present disclosure, a plurality of LDs 42 configured to have gains that allow laser oscillation in a wavelength range that includes, e.g., a range of 400 to 420 nm. In other words, a plurality of LDs 42 having a gain spectral width of about 20 nm with the largest gain at a wavelength of 410 nm are provided. Then, the structure and tilt angle of the transmission diffraction grating 48 are adjusted so that the minus-first order reflection-diffracted light R-1 returning from the transmission diffraction grating 48 to the respective LDs 42 will have wavelengths different from each other by several nanometers. Using the external-cavity laser modules 24 allows the laser beams to have a narrow spectral width, and lasing wavelengths of the laser beams to be stable. Accordingly, using the beam combiner 26 such as a diffraction grating, a plurality of laser beams can be coaxially combined in a desired direction, with a high precision.

The plurality of laser beams B of different peak wavelengths $\lambda_n$ thus obtained are coaxially combined using wavelength beam combining to form the wavelength-combined beam W. LDs 42 of an identical gain spectral width (e.g. a wavelength range from 20 to 30 nm) generally have semiconductor multilayer structures that are made of a semiconductor of an identical composition. In embodiments of the present disclosure, other appropriate configurations may also be employed. For example, the LDs 42 may include a laser diode(s) including a light emission layer with a semiconductor composition different from that of other laser diode(s) of LDs 42, and accordingly with a gain spectrum that is not the same as that of other laser diode(s) of LDs 42. More specifically, for example, a plurality of laser beams B having peak wavelengths in at least one of the color ranges of ultraviolet, violet, blue, and green may be employed in any appropriate combination, so that a wavelength-combined beam W of various spectra can be formed.

Figure 13:
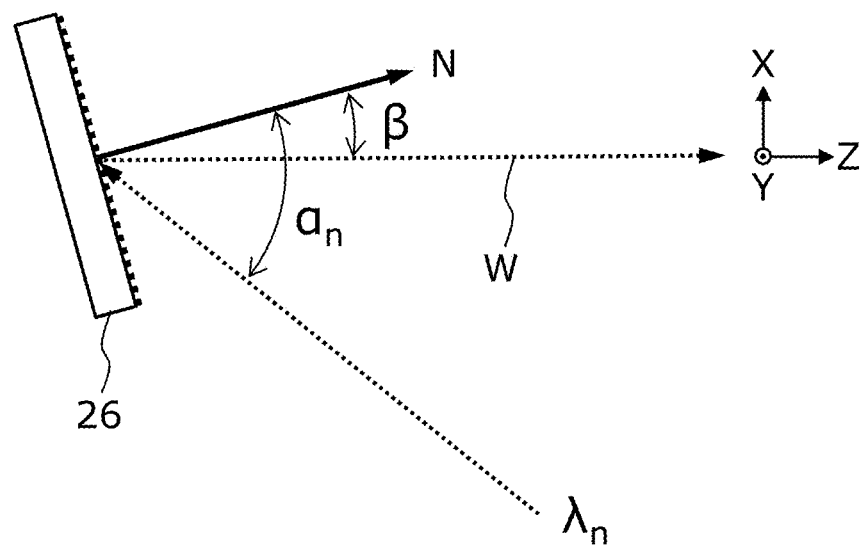
FIG. 13 is a diagram schematically showing the action of a reflection-type diffraction grating serving as a beam combiner 26 included in a beam light source 20 according to one embodiment.

FIG. 13 is a diagram showing the action of a reflection-type diffraction grating that is included in the beam light source 20 and serves as the beam combiner 26 according to the present embodiment. A laser beam B of a peak wavelength $\lambda_n$ is incident on the beam combiner 26 at an incident angle $\alpha_n$ relative to the normal direction N of the beam combiner 26. The minus-first order reflection-diffracted light is incident in the Z axis direction, at a diffraction angle $\beta$. In this case, the equation $\sin \alpha_n + \sin \beta = K \cdot m \cdot \lambda_n$ holds true, where K is the number of diffraction gratings per millimeter of the beam combiner 26, and m is the number of diffraction order.

In the present embodiment, laser beams B of peak wavelengths $\lambda_n$ that are different from each other are emitted from external-cavity laser modules 24, and are incident on the beam combiner 26 at appropriate incident angles $\alpha_n$. Accordingly, laser beams B that are diffracted by an identical diffraction angle $\beta$ are spatially overlapped, so that wavelength beam combining is performed. If a directional offset among the laser beams B occurs as described with reference to FIG. 3 etc., the plurality of laser beams B may not be properly combined, thus resulting in a deteriorated beam quality. However, the present embodiment allows for correcting the directions of the laser beams B, and therefore deteriorations in the beam quality can be reduced.

FIG. 7 and FIG. 8 are referenced again.

In addition to the above-described component elements, the external-cavity laser light source 200 according to the present embodiment includes: a heat sink 40 onto which LDs 42 are secured; and a motor M configured to control the orientation of the transmission diffraction grating 48. The heat sink 40 is a water-cooling type heat sink. Water hoses not shown in the figure are connected to a channel within the heat sink 40 via a pair of couplers 41. The heat sink 40 may preferably be made of a metal material having high thermal conductivity, e.g., copper. The heat sink 40 has an opening through which the LDs 42 are received. Lead terminals of the LDs 42 protrude out of the heat sink 40, so as to be electrically connected to wiring cables not shown in the figure.

The heat sink 40 is secured to a pillar-like member that extends from the support member 210 in parallel to the $Y_1$ axis. The transmission diffraction grating 48 is supported by the support member 210 rotatably around an axis that is parallel to the $Y_1$ axis. Moreover, the motor M is also supported by the support member 210, such that a rotation shaft of the motor M is connected to a rotation shaft of the transmission diffraction grating 48. Deceleration gears may be disposed between the motor M and the transmission diffraction grating 48 to reduce the number of revolutions of the motor M. When electric power is supplied to the motor M from an external component (not shown in the figure), the motor M is able to rotate the transmission diffraction grating 48 by a desired angle. The angular resolution of rotation of the transmission diffraction grating 48 is higher than the angular resolution of $\theta Y$ rotation of the support member 210, and thus allows more precise angular adjustments. Angular adjustments by the transmission diffraction grating 48 allows for precisely controlling the resonant wavelength (lasing wavelength) of the external cavity.

The support member 210 is rotatably supported by the base 220 via the adjustment mechanism 21X. With a screw 25 or the like, the angle of the support member 210 may be fixed with respect to the base 220. The base 220 is rotatably supported by the pedestal 250 via the adjustment mechanism 21Y. Adjustment of orientation or angle of the support member 210 with respect to the pedestal 250 using the adjustment mechanisms 21X and 21Y may be manually operated by an operator, or mechanically operated using an actuator such as a motor.

After the plurality of external-cavity laser modules 24 are arranged in the manner shown in FIG. 6, the angles of $\theta Y$ and $\theta X$ rotation are adjusted using the adjustment mechanisms 21X and 21Y so that a laser beam B emitted from each laser module 24 is incident on the same region of the beam combiner 26. Thereafter, while measuring the BPP of the wavelength-combined beam W, the angle of the transmission diffraction grating 48 in each individual laser module 24 may be finely adjusted. Such adjustments allows for controlling the diffraction angle $\beta$ of the laser beam B, so that the BPP of the wavelength-combined beam W can be further reduced.

In one example, eleven external cavity laser modules 24 that were adapted to emit laser beams having peak wavelengths $\lambda_n$ as shown in Table 1 below were provided, and were aligned to obtain incident angles $\alpha_n$ and a diffraction angle $\beta$ as shown in Table 1. In the obtained light source device 100, eleven laser beams of different peak wavelengths, all emitted at the same diffraction angle $\beta$ from the beam combiner (reflection-type diffraction grating) 26, were coaxially combined to generate a single wavelength-combined beam. In this example, K was 2222 mm$^{-1}$, and the optical path length (L1+L2) was about 1800 mm.

TABLE 1

| module # n | peak wavelength $\lambda_n$ (nm) | incident angle $\alpha$ | diffraction angle $\beta$ |
|---|---|---|---|
| 1 | 399.13 | 42.90 | 11.90 |
| 2 | 401.53 | 43.32 | 11.90 |
| 3 | 403.93 | 43.74 | 11.90 |
| 4 | 406.30 | 44.16 | 11.90 |
| 5 | 408.66 | 44.58 | 11.90 |
| 6 | 411.00 | 45.00 | 11.90 |
| 7 | 413.32 | 45.42 | 11.90 |
| 8 | 415.63 | 45.84 | 11.90 |
| 9 | 417.92 | 46.26 | 11.90 |
| 10 | 420.19 | 46.68 | 11.90 |
| 11 | 422.45 | 47.10 | 11.90 |

In this example, LDs 42 having gain at wavelengths in a range of about 399 to 422 nm are used. In other words, the gain spectral width $\Delta\lambda$ is about 23 nm. As is clear from Table 1, there exists a wavelength difference $\delta\lambda$ of about 2.3 nm between the peak wavelength $\lambda_n$ of a laser beam emitted from an $n^{th}$ laser module 24$_n$ and the peak wavelength $\lambda_{n+1}$ of a laser beam emitted from an n+1th laser module 24$_{n+1}$. Moreover, there exists a difference in angle of about 0.42 degrees between the incident angle $\alpha_n$ of a laser beam emitted from an $n^{th}$ laser module 24$_n$ and the incident angle $\alpha_{n+1}$ of a laser beam emitted from an n+1th laser module 24$_{n+1}$.

Any appropriate configurations other than those described in the example above may be employed in embodiments according to the present disclosure. For example, a plurality of LDs having a gain spectral width of, e.g., several tens of nanometers selected from within a wavelength range of, e.g., 350 to 550 nm may be used, which allows for performing wavelength beam combining in a various wavelength bands. In a wavelength range of 350 to 550 nm (and especially in the range of 400 nm to 470 nm), metals such as copper has a high absorptance, and accordingly, a wavelength-combined beam that is appropriate for metal machining can be obtained.

The wavelength-combined beam W emitted from the beam light source 20 having the structure described above has a beam quality asymmetric between the Y axis (slow axis) direction and the X axis (fast axis) direction. This will be described below.

Figure 14:
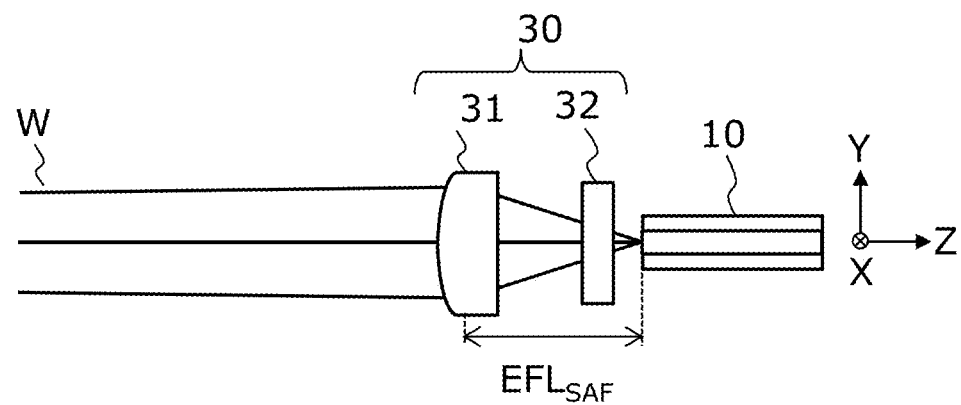
FIG. 14 is a cross-sectional view schematically showing an example of the structure of an optical coupling device 30.

FIG. 14 is a diagram schematically showing an example of the structure of the optical coupling device 30. In this example, the optical coupling device 30 includes a first cylindrical lens (slow-axis converging lens) 31 configured to focus light in a first plane (YZ) and a second cylindrical lens (fast-axis converging lens) 32 configured to focus light in a second plane (XZ). The position of an image-side principal point of the first cylindrical lens 31 is distant from an incident end surface of the optical fiber 10 by the focal length (effective focal length) $EFL_{SAF}$ of the cylindrical lens 31. Therefore, with the action of the first cylindrical lens 31, the wavelength-combined beam W having been incident on the first cylindrical lens 31 is focused onto the incident end surface of the optical fiber 10.

In the present embodiment, the Y axis in FIG. 14 is parallel to the slow axis, and the X axis is parallel to the fast axis. While a laser beam that is emitted from the laser diode 42 propagates over a long distance (e.g. 400 mm or more) after being collimated, the shape of a cross section of the laser beam changes into an elliptic shape longer along the Y axis direction than along the X axis direction. This occurs due to a lower beam quality along the Y axis direction, i.e., the slow axis.

Direct Diode Laser System

Figure 15:
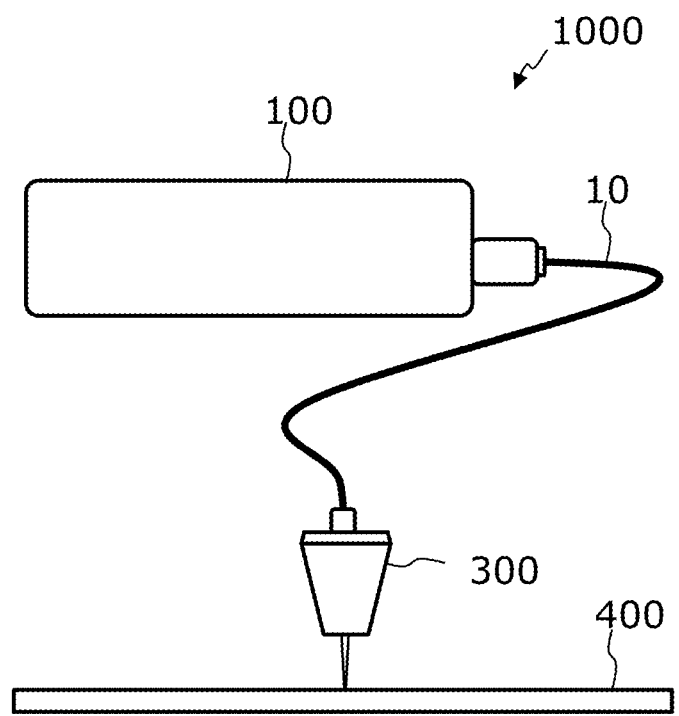
FIG. 15 is a diagram showing an example of the structure of a DDL system 1000 according to one embodiment.

Next, with reference to FIG. 17, a direct diode laser (DDL) system according to one embodiment of the present disclosure will be described. FIG. 15 is a diagram schematically showing an example of the structure of a DDL system 1000 according to the present embodiment.

The DDL system 1000 shown in FIG. 17 includes a light source device 100, and a processing head 300 connected to an optical fiber 10 that extends from the light source device 100. The processing head 300 irradiates a target object 400 with a wavelength-combined beam emitted from the optical fiber 10. In the example shown in FIG. 13, a single light source device 100 is employed.

The light source device 100 in this example has a structure similar to the structure of the light source device 100 described above. Any appropriate number of external-cavity laser modules may be mounted in the light source device 100, and the number of external-cavity laser modules mounted in the light source device 100 may be determined in accordance with the optical output power or irradiance that is needed. The wavelength of the laser light to be radiated from each external-cavity laser module may also be selected in accordance with the material to be processed. For example, when processing copper, brass, aluminum or the like, LDs having a central wavelength in the range of 350 nm to 550 nm may be preferably employed.

According to the present embodiment, a high-power laser beam is generated through wavelength beam combining, and is efficiency coupled onto an optical fiber, so that a high-power density laser beam having high beam quality can be obtained with a high efficiency of energy conversion.

A light source device according to the present disclosure can be used for a wide range of applications where high-power laser light with a high beam quality is needed to be radiated from an optical fiber. The light source device according to the present disclosure may be used in industrial fields where high-power laser light sources are needed, e.g., cutting or holing of various materials, local heat treatments, surface treatments, metal welding, 3D printing, and the like.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A light source device comprising:
a plurality of external cavity laser modules configured to emit a plurality of laser beams of different peak wavelengths, each of the plurality of external cavity laser modules configured to emit a respective one of the plurality of laser beams; and
a beam combiner configured to coaxially combine the plurality of laser beams to generate a wavelength-combined beam, wherein:
each of the plurality of external cavity laser modules comprises:
a collimation laser light source having a Littrow configuration, and
a diffraction grating configured to selectively reflect and transmit light of a predetermined wavelength,
the plurality of external cavity laser modules are arranged so that the plurality of laser beams are incident at different angles on a same region of the beam combiner, and
each of the plurality of external cavity laser modules comprises:
a support member supporting the collimation laser light source and the diffraction grating, and
a base rotatably supporting the support member to correct an axial direction of a laser beam emitted from a respective one of the plurality of external cavity laser modules.

2. The light source device of claim 1, wherein:
in each of the plurality of external cavity laser modules, each of the support member and the base has a longitudinal axis in a direction parallel to the axial direction of the laser beam, and the base is disposed on a pedestal, and
each of the plurality of external cavity laser modules comprises:
a first adjustment mechanism connecting the base to the pedestal such that the longitudinal axis of the base is rotatable with respect to the pedestal, and
a second adjustment mechanism connecting the support member to the base such that the longitudinal axis of the support member is rotatable with respect to the base around a horizontal axis.

3. The light source device of claim 2, wherein:
the support member has a length of 80 mm or more along the longitudinal axis of the support member, the support member has a width of 12 mm or less along a horizontal direction that is orthogonal to the longitudinal axis of the support member, and each of the first adjustment mechanism and the second adjustment mechanism has a width along the horizontal direction equal to or less than the width of the support member along the horizontal direction.

4. The light source device of claim 3, wherein:

in each of the plurality of external cavity laser modules, the first adjustment mechanism and the second adjustment mechanism are disposed at positions closer to an end of the support member along the longitudinal axis than to a center of the longitudinal axis of the support member along the longitudinal axis.

5. The light source device of claim 2, wherein:

in each of the plurality of external cavity laser modules, the first adjustment mechanism and the second adjustment mechanism connect the support member to the base, and the first adjustment mechanism and the second adjustment mechanism restrict movement of the support member with respect to the base other than rotation of the support member with respect to the base.

6. The light source device of claim 1, wherein:

each of the collimation laser light sources comprises:
- a laser diode accommodated in a sealed semiconductor laser package, and
- a lens configured to collimate laser light that is emitted from the laser diode.

7. The light source device of claim 1, wherein:

each of the peak wavelengths is in a range of 350 nm to 550 nm.

8. The light source device of claim 7, wherein:

each of the peak wavelengths is in a range of 400 nm to 470 nm.

9. The light source device of claim 1, wherein:

the plurality of external cavity laser modules comprises five or more external cavity laser modules.

10. The light source device of claim 1, wherein:

an interval between the angles at which the plurality of laser beams are incident on the same region of the beam combiner is 1 degree or less.

11. The light source device of claim 10, wherein:

an interval between the peak wavelengths of the plurality of laser beams is 5 nm or less.

12. An external cavity laser module configured to emit a laser beam, the external cavity laser module comprising:
- a collimation laser light source having a Littrow configuration;
- a diffraction grating configured to selectively reflect and transmit light of a specific wavelength;
- a support member supporting the collimation laser light source and the diffraction grating; and
- a base rotatably supporting the support member to correct an axial direction of the laser beam emitted from the external cavity laser module.

* * * * *